United States Patent [19]

Hasegawa et al.

[11] Patent Number: 5,415,728

[45] Date of Patent: May 16, 1995

[54] METHOD OF PERFORMING PLAIN ETCHING TREATMENT AND APPARATUS THEREFOR

[75] Inventors: Makoto Hasegawa, Kawasaki; Atsuo Sanda, Yokohama, both of Japan

[73] Assignee: Kabushiki Kaisha Toshiba, Kawasaki, Japan

[21] Appl. No.: 4,413

[22] Filed: Jan. 14, 1993

[30] Foreign Application Priority Data

Jan. 17, 1992 [JP] Japan .................................. 4-006605

[51] Int. Cl.⁶ .......................................... H10L 21/00
[52] U.S. Cl. .................................. 156/643.1; 156/345
[58] Field of Search ............... 156/643, 345, 646, 664, 156/662; 118/723

[56] References Cited

U.S. PATENT DOCUMENTS

| | | | |
|---|---|---|---|
| 4,427,515 | 1/1984 | Yuhara et al. | 204/192 E |
| 5,084,126 | 1/1992 | McKee | 156/345 |
| 5,105,761 | 4/1992 | Charlet et al. | 156/345 |

FOREIGN PATENT DOCUMENTS 62-031125  2/1987  Japan .
2-010725   1/1990  Japan .
5-036646   2/1993  Japan .

*Primary Examiner*—R. Bruce Breneman
*Assistant Examiner*—George Goudreau
*Attorney, Agent, or Firm*—Finnegan, Henderson, Farabow, Garrett & Dunner

[57] ABSTRACT

Disclosed herein are a dry etching method and a dry etching apparatus. The method comprises a step of applying an etching inhibiting gas to that portion of a workpiece where etching speed is high, while the workpiece is being etched with reactive-gas plasma. The apparatus comprises functions for holding a reactive etching gas, a first electrode located within the gas-holding functions, for supporting a workpiece, a second electrode located within the gas-holding functions and spaced apart from the first electrode by a predetermined distance, functions for supplying high-frequency power, thereby to convert the reactive etching gas into a plasma in the space between the first and second electrodes, and functions for supplying an etching inhibiting gas to that portion of the workpiece where etching speed is high.

4 Claims, 4 Drawing Sheets

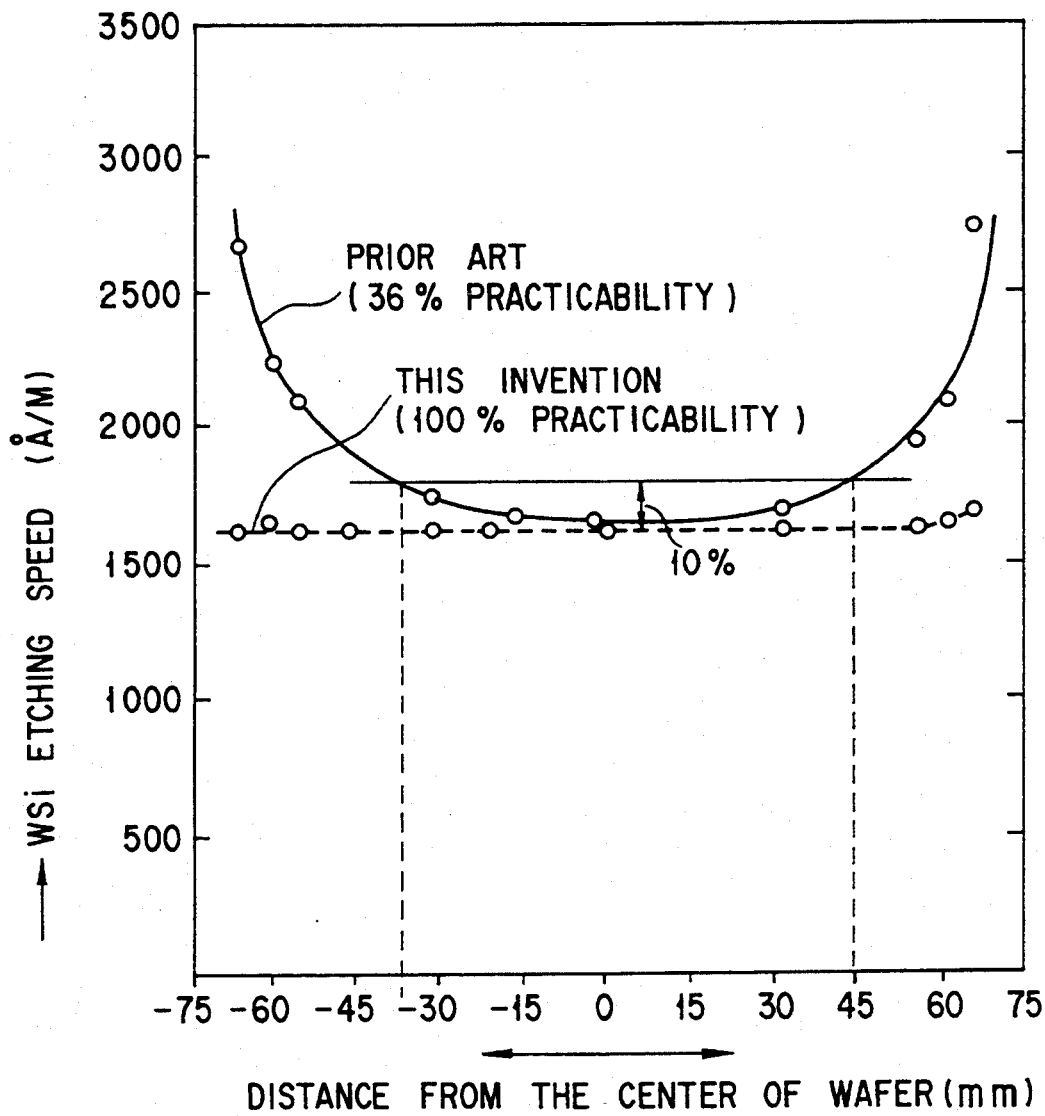
F I G. 3

| ETCHING FILM | REACTION GAS | REACTION PRODUCT GAS |
|---|---|---|
| WSi | HBr, BBr$_3$<br>Cl$_2$, SiCl$_4$ | WBr$_6$<br>WCl$_6$ |
| MoSi | Cl$_2$, SiCl$_4$<br>SiF$_4$, F$_2$, CF$_4$<br>HBr, BBr$_3$ | MoCl$_6$<br>MoF$_6$<br>MoBr$_6$ |
| Si | Cl$_2$, SiCl$_4$<br>SiF$_4$, F$_2$, CF$_4$<br>HBr, BBr$_3$ | SiCl$_4$<br>SiF$_4$<br>SiBr$_4$ |
| PHOTORESIST | O$_2$, CO, H$_2$O<br>O$_2$, CO, H$_2$O | CO$_2$<br>CO |
| Al | Cl$_2$, BCl$_3$, SiCl$_4$<br>HBr, BBr$_3$ | AlCl$_3$<br>AlBr$_3$ |

FIG. 6

METHOD OF PERFORMING PLAIN ETCHING TREATMENT AND APPARATUS THEREFOR

BACKGROUND OF THE INVENTION

1. Field of the Invention

The present invention relates to a dry etching method of forming a fine pattern in manufacturing, for example, a semiconductor device, and also to a dry etching apparatus for forming such a fine pattern.

2. Description of the Related Art

Known as micro-process techniques for manufacturing semiconductor devices are microwave plasma etching, reactive ion etching, and the like. The reactive ion etching includes a method using parallel flat electrodes, a method utilizing electron cyclotron resonance (ECR), and the like.

In a conventional reactive ion etching apparatus, the upper electrode is mounted on the top of the reaction chamber, and the lower electrode, which extends parallel to the upper electrode, is located within the reaction chamber. The upper electrode has a hollow and is grounded. A gas pipe is connected to the upper surface of the upper electrode, for introducing a reaction gas into the hollow. The upper electrode has a plurality of through holes in its lower surface, through which to supply the reaction gas into the reaction chamber. A workpiece, such as a silicon wafer, is mounted on the lower electrode. The lower electrode is connected by a blocking capacitor to a high-frequency power supply. The lower electrode is surround by a baffle plate which is located within the reaction chamber, as well. The baffle plate has a plurality of through holes. An exhaust pipe is connected to the side of the reaction chamber, for exhausting the reaction gas from the reaction chamber.

To etch the workpiece, the reaction gas is introduced into the reaction chamber through the holes made in the lower surface of the upper electrode. The gas is exhausted from the chamber through the exhaust pipe, thereby controlling the gas pressure within the reaction chamber. At the same time, a high-frequency power is supplied from the high-frequency power supply to the lower electrode, generating a plasma in the space between the upper and lower electrodes. The plasma thus generated is applied to the workpiece, whereby the target film formed on the workpiece is etched.

During the etching process, the reaction gas is introduced into the chamber through the holes of the upper electrode and is exhausted from the chamber through the exhaust pipe. Part of this gas reacts with the plasma and changes into a reaction-product gas. The reaction-produce gas is exhausted from the chamber through the exhaust pipe. That part of the reaction-product gas which has been generated at the periphery of the workpiece is immediately exhausted, but that part of the gas which has been generated at the center portion of the workpiece is hard to exhaust. Thus, less reaction-product gas accumulates on the edge portion of the workpiece than on the center portion thereof. As a consequence, the edge portion of the workpiece is etched faster than the center portion of the workpiece.

SUMMARY OF THE INVENTION

The object of the present invention is to provide a dry etching method and a dry etching apparatus, which can etch every portion of a silicon wafer (including a center portion and an edge portion) at sufficiently uniform speed.

According to the invention, there is provided a dry etching method comprising a step of applying an etching inhibiting gas to that portion of a workpiece where etching speed is high, while the workpiece is being etched with reactive-gas plasma etching of the workpiece.

Also, according to the invention, there is provided a dry etching apparatus comprising: means for holding a reactive etching gas; a first electrode located within the gas-holding means, for supporting a workpiece; a second electrode located within the gas-holding means and spaced apart from the first electrode by a predetermined distance; means for supplying high-frequency power, thereby to convert the reactive etching gas into a plasma in the space between the first and second electrodes; and means for supplying an etching inhibiting gas to that portion of the workpiece where etching speed is high.

The etching method of this invention solves the problem with the conventional method in which the portions of a workpiece cannot be etched at the same speed. To be more specific, the etching inhibiting gas is applied in a prescribed amount to the edge portion of the workpiece, thus inhibiting the etching of the edge portion on which no reaction-product gas accumulates. The edge portion which should otherwise be etched too fast is, therefore, etched at substantially the same speed as the other portion, such as the center portion, on which the reaction-product gas accumulates. As a result, every portion of the workpiece can be etched uniformly.

The dry etching apparatus of the invention, described above, is designed to perform this drying etching method. In the apparatus, the etching inhibiting gas is applied in a prescribed amount to that portion of a workpiece which may be etched excessively, thus inhibiting the etching of the this portion, whereby every portion of the workpiece can be etched uniformly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a graph representing the speed at which the embodiment of FIG. 1 etches a workpiece, and also the speed at which a conventional dry etching apparatus etches a workpiece;

FIG. 6 is a table representing various combinations of a film to etch, a reaction gas and an etching inhibiting gas, which can be adopted in the present invention.

DETAILED DESCRIPTION OF THE PREFERRED EMBODIMENTS

An embodiment of the present invention will now be described with reference to the accompanying drawings.

Figure 1:
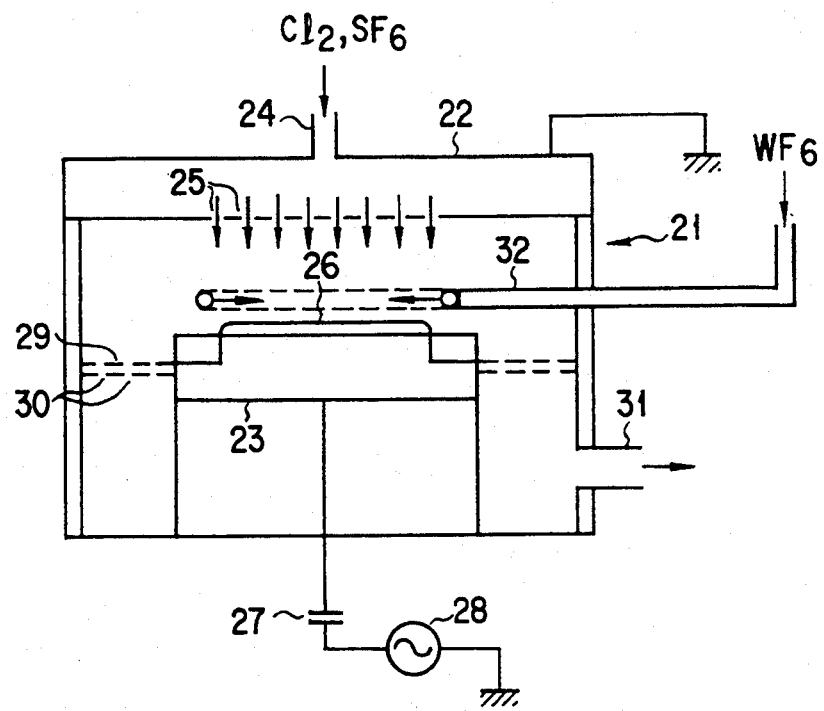
FIG. 1 is a structure diagram showing a first embodiment of the present invention.

As shown in FIG. 1, a plasma etching apparatus of the invention comprises a reaction chamber 21, which is made of aluminum and has its inner surface alumite-treated. An upper electrode 22 is mounted on the top of the reaction chamber 21, and a lower electrode 23 is held within the chamber 21. The electrodes 22 and 23 are flat plates located in parallel to each other. The upper electrode 22 is a hollow member which has through holes made in its lower surface. A first gas pipe 24 is connected to the top of the upper electrode 22, for introducing a reaction gas into the reaction chamber 21 through the holes of the upper electrode 22.

A workpiece 26, such as a silicon wafer, is placed on the lower electrode 23. The workpiece 26 is held by means of a mechanism (not shown) fixed to the lower electrode 23. The lower electrode 23 is connected by a blocking capacitor 27 to a high-frequency power supply 28. In the reaction chamber 21, the lower electrode 23 is surrounded by a baffle plate 29, which has a plurality of through holes 30. An exhaust pipe 31 is connected to one side of the reaction chamber 11.

Figure 2A:
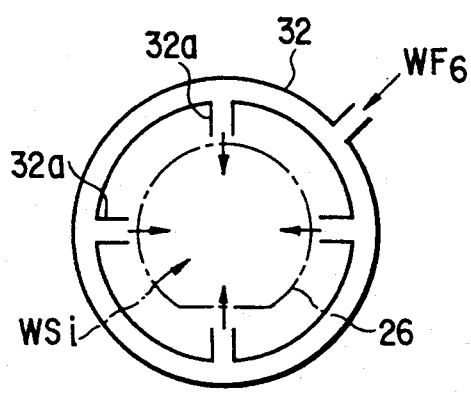
FIGS. 2A and 2B are plan views, both showing the main section of the embodiment shown in FIG. 1.
Figure 2B:
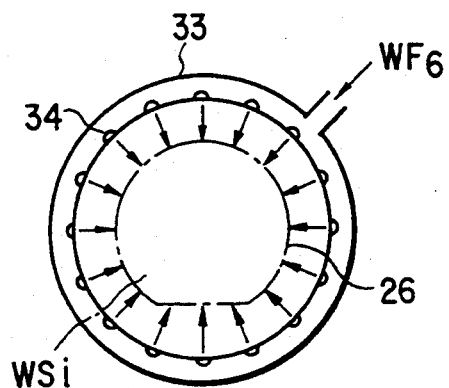

The apparatus further comprises a second gas pipe 32. The second gas pipe 32 extends into the reaction chamber 21. As is shown in FIG. 2A, it has a loop at its inner end, which surrounds the workpiece 26. The loop has a plurality of nozzles 32a, through which to apply at least one gas onto the edge portion of the workpiece 26, said gas being similar to a reaction-product gas. Alternatively, as shown in FIG. 2B, the loop may have a number of holes 34 so that the gas can be applied more uniformly onto the edge portion of the workpiece 26.

If the workpiece 26 has a WSi film to be etched, a reaction gas, which is a mixture of $Cl_2$ and $SF_6$, is introduced into the reaction chamber 21 through the upper electrode 22, and reaction-product gases, which are $WF_6$, and $SiCl_4$, and the like will be generated in the chamber 21. In this case, $WF_6$ gas, for example, is introduced as etching inhibiting gas into the chamber 21 through the second gas pipe 32.

To etch the WSi film on the workpiece 26, the reaction gases $Cl_2$ and $SF_6$ are supplied into the chamber 21 through the holes 25 of the upper electrode 22. Simultaneously, the etching inhibiting gas $WF_6$ is introduced into the chamber 21 through the second gas pipe 32. This etching inhibiting gas is supplied in an amount equal to that of the reaction-product gas being generated at the center portion of the workpiece 26. The reaction-product gases and the etching inhibiting gas are discharged from the chamber 21 through the exhaust pipe 31, thereby controlling the pressure within the reaction chamber 21. At the same time, the high-frequency power supply 28 supplies high-frequency power to the lower electrode 23, generating a plasma in the gap between the electrodes 22 and 23. The plasma is applied onto the SWi film, thus etching this film.

As the reaction gases are supplied into the chamber 21, gradually etching the SWi film on the workpiece 26, the reaction-product gas generated through the reaction accumulates on the workpiece 26, more at the center portion than in the edge portion. Nonetheless, the SWi film is uniformly etched, or etched at the same speed at the center portion and the edge portion. This is because the etching inhibiting gas (i.e., $WF_6$ gas), which is similar to the reaction-product gas, is applied onto the edge portion of the workpiece 26 in an amount substantially equal to that of the reaction-product gas being generated at the center portion of the work piece 26.

The etching inhibiting gas is not necessarily be one similar to the reaction-product gases. Whatever gas that can inhibit the etching reaction can be used instead, to etch the WSi film uniformly.

The broken line in FIG. 3 represents the relation between the speed at which the embodiment of FIG. 1 etches a portion of the WSi film and the distance at which this portion is located from the center of the workpiece 26. On the other hand, the solid line shown in FIG. 3 illustrates the relation between the speed at which a conventional plasma etching apparatus etches a portion of a WSi film formed on a workpiece and the distance at which this portion is located from the center of the workpiece. As is evident from FIG. 3, the plasma etching apparatus of the invention, shown in FIG. 1 and FIG. 2A (or FIG. 2B), can etch a WSi film uniformly—that is, to the same extent at the center portion and the edge portion.

Let us consider, here, the yield of integrated circuits formed on a semiconductor wafer subjected to plasma etching. In the conventional plasma etching apparatus, the etching speed at the center portion of the wafer differs by more than 10% from the etching speed at the edge portion thereof. Consequently, the yield of the integrated circuits formed on the wafer is only about 36% at best. By contrast, in the apparatus of the present invention, the etching speed at the center portion of the wafer differs by 10% or less from that at the edge portion thereof. As a result, the yield of the integrated circuits formed on the wafer can be about 100%.

As may be understood from FIG. 1, both electrodes 22 and 23 are of the same type employed in the conventional plasma etching apparatus. Hence, the apparatus of the invention can be manufactured easily.

Figure 4:
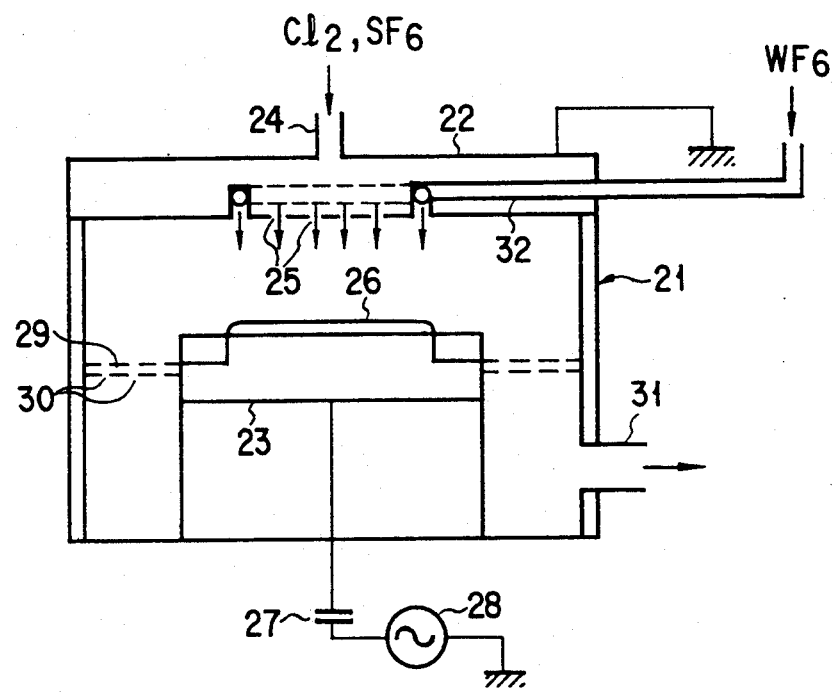
FIG. 4 is a structure diagram illustrating a second embodiment of the invention.
Figure 5:
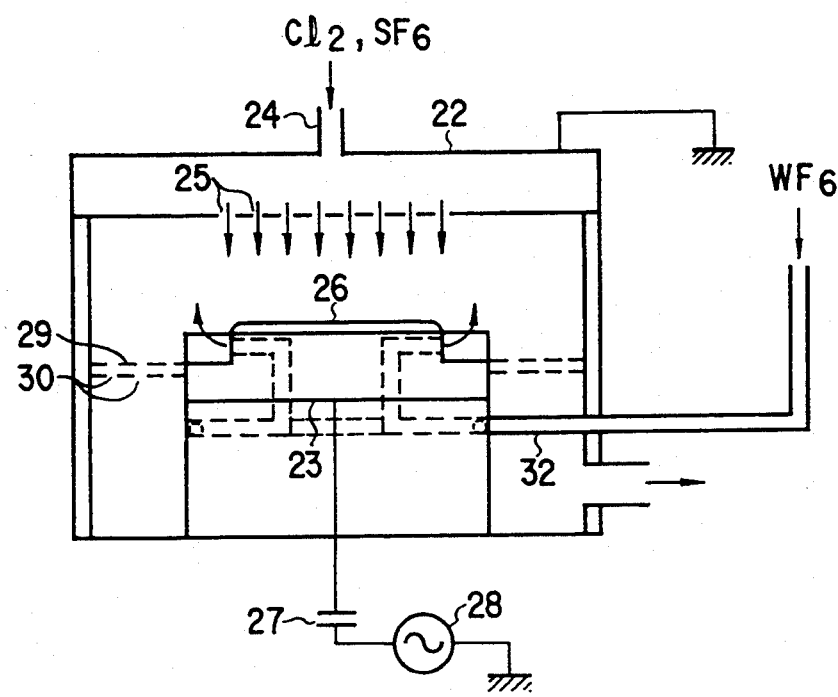
FIG. 5 is a structure diagram illustrating a third embodiment of the invention.

FIGS. 4 and 5 show the second and the third embodiment of the present invention, in which a second gas pipe is located in part within a reaction chamber. The components identical to those of the apparatus shown in FIG. 1 are denoted at the same reference numerals and will not be described in detail.

In the second embodiment of FIG. 4, the looped portion of the second gas pipe 32 is arranged within an upper electrode 22 and has nozzles. The nozzles extend downwards, made in the lower surface of the upper electrode 22, and located in a circle around the through holes 25 cut in the lower surface of the electrode 22. In the second embodiment of FIG. 4, the looped portion of the second gas pipe 32 is formed within a lower electrode 23 and has nozzles. The nozzles extend horizontally, made in the upper peripheral portion the lower electrode 23, and opens in the periphery of the upper portion of the lower electrode 23.

The embodiments of FIGS. 4 and 5 can perform plasma etching on the center and edge portions of a workpiece 26 at the same speed, as well.

As has been indicated, the etching speed at the edge portion of the workpiece 26 is reduced to the etching speed at the center portion, i.e., the low etching speed. This does not matter at all, because the etching speed at the center portion can be increased by raising the temperature within the reaction chamber 21.

FIG. 6 is a table showing various combinations of a film to etch, a reaction gas and a etching inhibiting gas. Any one of the combinations shown can be employed in the present invention. As has been pointed out, the etching inhibiting gas is not necessarily be one similar to the reaction-product gases; any gas able to inhibit etching reaction and free of chemical influence of another gas whatever can be applied instead, to achieve the same result.

In the first to third embodiments, as has been described, the second gas pipe 32 has its gas-applying unit in the vicinity of the edge portion of the workpiece 26. Instead, the pipe 32 may be so positioned as to apply the etching inhibiting gas to any portion of the workpiece 26 that should otherwise be etched at higher speed than other portions.

All embodiments described above are plasma etching apparatuses. Nevertheless, this invention is not limited to this type of a dry etching apparatus. It can be applied to a barrel-type etching apparatus, a downflow type etching apparatus, an ECR plasma etching apparatus, and the like.

Moreover, various changes and modification can of course be made, without departing the scope and spirit of the present invention.

As described above, the present invention can provide a dry etching method and a dry etching apparatus, which can etch every portion of a silicon wafer (including a center portion and an edge portion) at sufficiently uniform speed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dry etching method comprising a step of applying an etching inhibiting gas to that portion of a workpiece where etching speed is higher by 10% or more than an etching speed at a central portion of the workpiece, while the workpiece is being etched with reactive-gas plasma, wherein the etching inhibiting gas includes one of gases generated while the workpiece is being etched with reactive-gas plasma.

2. A dry etching method according to claim 1, wherein the etching inhibiting gas includes a metal halide gas.

3. A dry etching method according to claim 1, wherein the etching inhibiting gas includes a silicon halide gas.

4. A dry etching method according to claim 1, wherein the etching inhibiting gas includes an carbon oxide gas.

* * * * *